United States Patent

Inai et al.

[11] Patent Number: 6,008,509
[45] Date of Patent: *Dec. 28, 1999

[54] FIELD EFFECT TRANSISTOR

[75] Inventors: Makoto Inai, Ohmihachiman; Hiroyuki Seto; Fujio Okui, both of Shiga-ken; Susumu Fukuda, Mishima-gun; Hisashi Ariyoshi, Kyoto, all of Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/998,248

[22] Filed: Dec. 24, 1997

[30] Foreign Application Priority Data

Dec. 25, 1996 [JP] Japan .................................. 8-344795
Dec. 9, 1997 [JP] Japan .................................. 9-338566

[51] Int. Cl.[6] ........................ H01L 29/772; H01L 29/812
[52] U.S. Cl. .............................................................. 257/192
[58] Field of Search .................................... 257/192, 194

[56] References Cited

U.S. PATENT DOCUMENTS

| | | | |
|---|---|---|---|
| 4,745,447 | 5/1988 | Chen et al. | 257/192 |
| 5,091,759 | 2/1992 | Shih et al. | 257/192 |
| 5,250,822 | 10/1993 | Sonoda et al. | 257/194 |
| 5,331,410 | 7/1994 | Kuwata | 257/192 |
| 5,404,032 | 4/1995 | Sawada et al. | 257/192 |

FOREIGN PATENT DOCUMENTS

| | | |
|---|---|---|
| 0205164 | 12/1986 | European Pat. Off. . |
| 8-55979 | 2/1996 | Japan . |
| 9311566 | 6/1993 | WIPO . |

OTHER PUBLICATIONS

Liu W–C et al.: "Performance Enhancement in a Metal–Insulator–Semiconductor–Like Pseudomorphic Transistor by Utilizing an AN–Gaas/n+–IN0.2GA0.8As Two–Layer Structure" Mar. 20, 1995, Applied Physics Letters, vol. 66, NR. 12, pp. 1524–1526.

Kim B et al: "Millimeter–Wave AlGaAs/InGaas/Gaas Quantum Well Power MISFET" Dec. 11, 1988, International Electron Devices Meeting, San Francisco, Dec. 11–14, 1988, pp. 168–171, Institute of Electrical and Electronics Engineers.

Primary Examiner—John Guay
Attorney, Agent, or Firm—Ostrolenk, Faber, Gerb & Soffen, LLP

[57] ABSTRACT

A heterostructure insulated-gate field effect transistor comprises a channel layer, barrier layer and a contact layer. The barrier layer is made of a material having an electron affinity smaller than that of the channel layer and equal to that of the contact layer. Due to the single heterostructure, the series resistance between the channel layer and the source (drain) electrode can be decreased without employing complicated selective ion implanting or selective epitaxial growing method.

11 Claims, 5 Drawing Sheets

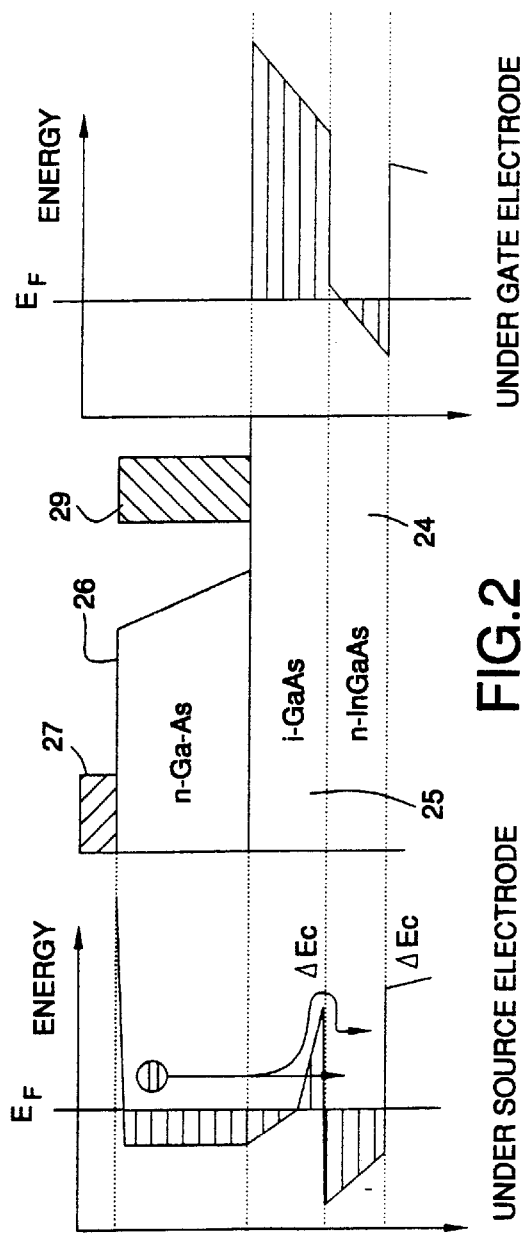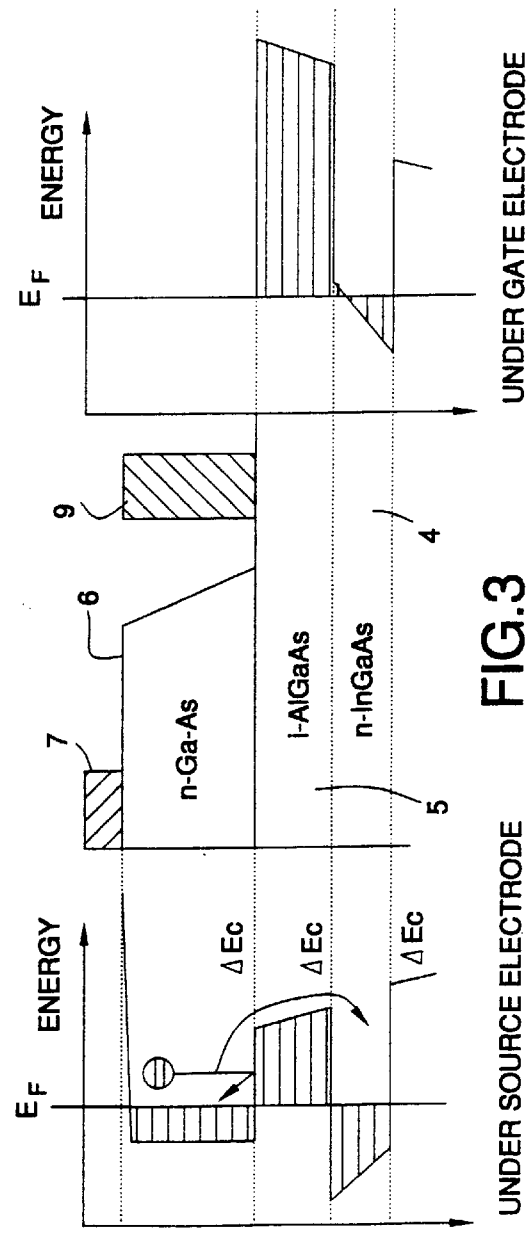

FIELD EFFECT TRANSISTOR

BACKGROUND OF THE INVENTION

1. Field of the Invention

The present invention relates to a field effect transistor, and more particularly to a heterostructure insulated-gate field effect transistor.

2. Description of the Related Art

There has been increasing in recent years a demand for field effect transistors of high performances. In order to improve the performance of a field effect transistor, it is generally required that a channel layer of a field effect transistor be thinner and have a higher carrier concentration. However, in the case where a channel layer is made thinner with a higher carrier concentration in a conventional field effect transistor having a structure in which a channel layer is disposed immediately under a gate electrode, the gate breakdown voltage becomes lower due to the higher carrier concentration, thereby restricting an improvement in the performance of the transistor.

In order to overcome the above drawback, a heterostructure insulated-gate field effect transistor 1 (HIGFET) shown in FIG. 7 has been proposed. The field effect transistor 1 has a stacked structure formed by an epitaxial growing method. More specifically, in the field effect transistor 1, a high-resistance semiconductor buffer layer 3 is formed on a GaAs semi-insulating substrate 2. An n-GaAs low-resistance channel layer 4 is formed on the buffer layer 3, and a high-resistance barrier layer 5 made from and undoped high-bandgap material, for example, i-AlGaAs, is disposed on the channel layer 4. Moreover, an n-GaAs low-resistance contact layer 6 is formed on the barrier layer 5.

A source electrode 7 and a drain electrode 8, both of which are formed of ohmic electrodes, are disposed on the surface of the contact layer 6, thereby forming a source region and a drain region, respectively. Moreover, the contact layer 6 is partially removed to expose the barrier layer 5. A gate electrode 9 made of a Schottky electrode is disposed on the surface of the barrier layer 5, thereby forming a gate region.

According to the structure, the barrier layer 5 is disposed on the channel layer 4. Thus, the channel layer 4 can further be made thinner with high carrier concentration without seriously impairing a reduction in the gate breakdown voltage, which has been discussed above, thereby enhancing the performance of the field effect transistor 1.

In the field effect transistor 1 shown in FIG. 7, however, the barrier layer 5, which is made from a high-resistance and high-bandgap material, is provided between the contact layer 6 and the channel layer 4. This disadvantageously increases the access resistance from each of the source and drain regions to the channel layer 4 (the series resistance between the source/gate or the drain/gate).

As the method for overcoming the above drawbacks, the following methods for reducing the series resistance components of the source and drain regions have been proposed: (1) the method for selectively implanting ions into the source and drain electrodes (DMT: Doped channel hetero Mis-FET); and (2) the method for regrowing a low-resistance crystal in the source and drain regions (DC-HIGFET: Doped Channel Heterostructure Insulated-Gate FET).

FIG. 8 illustrates an insulated-gate field effect transistor 10 obtained by using the above selective ion-implanting method (1). A low-resistance Si-doped ion-implanted layer 11 is formed in each of the source region and the drain region. Although the series resistance components of the source and drain region can be reduced in the insulated-gate field effect transistor 10, the selective ion-implanting method shown in FIG. 8 requires complicated and time-consuming process steps, such as ion implantation, the formation of a protective film (plasma process at approximately 300° C.), heat treatment (approximately 800° C.) for activating the implanted ions, and the removal of the protective film, after completing the epitaxially growing step. This increases the manufacturing cost and also deteriorates the characteristics of the field effect transistor 10, such as reproducibility and uniformity.

Moreover, during the high-temperature heat treatment process step, the impurity distribution which is precontrolled by the epitaxial growing may be disordered. Additionally, since the plasma process is performed to form the protective film, the GaAs substrate 2 and the semiconductor layers 3 through 5 may be seriously damaged.

FIG. 9 shows an insulated-gate field effect transistor 12 obtained by using the above selective regrowing method (2). A low-resistance n-GaAs regrown layer 13 obtained by regrowing a low-resistance crystal region is disposed in each of the source region and the drain region.

The selective regrowing method illustrated in FIG. 9 also requires a complicated process. More specifically, after the semiconductor layers 3 through 5 are epitaxially grown on the GaAs substrate 2, a pattern of, for example, a protective film, is made. Then, portions of the semiconductor layers 3 through 5 are etched by using the protective film as a mask, and the n-GaAs regrown layer 13 is epitaxially grown. Accordingly, in this regrowing method, as well as in the foregoing ion implanting method, the process is complicated and time-consuming. This increases the manufacturing cost and also deteriorates the characteristics of the field effect transistor 12, such as reproducibility and uniformity.

Further, in the selective regrowing method, growing selectivity requires a protective film pattern, and a large amount of impurity remains on the regrowing interface, which adversely influences the reliability and characteristics of the field effect transistor 12.

As is seen from the foregoing description, the field effect transistors 10 and 12 having the structures shown in FIGS. 8 and 9, respectively, present the problems of a complicated manufacturing process, poor reproducibility and reliability, which further deteriorates the characteristics of the transistor. Both the field effect transistors 10 and 12 also need the patterning spaces between the gate electrode and the source or drain electrode so as to allow a photolithographic process to be performed. This means that a longer distance between the gate electrode and the source or drain electrode is required, which results in an increase of series resistance adversely. That is, the series resistance cannot be reduced in spite of requiring a complicated process.

For the reasons explained above, a heterostructure insulated-gate field effect transistor having an excellent performance has not been realized commercially, and there is a need for a field effect transistor which has a low series resistance and can be produced by a simple production process.

SUMMARY OF THE INVENTION

The present invention is directed to a field effect transistor that satisfies this need. In accordance with one aspect of the invention, the field effect transistor comprises a substrate, a channel layer over the substrate, at least a first barrier layer over the channel layer, and a contact layer over the first barrier layer. The channel layer is made of a material having an electron affinity greater than that of the first barrier layer and the contact layer is made of a material having the same electron affinity as that of the first barrier layer. The gate electrode is in contact with the first barrier layer and source and drain electrodes are in contact with the contact layer.

In accordance with another aspect of the invention, the field effect transistor comprises a semiconductor structure disposed on a substrate. The semiconductor structure includes, in order, from bottom to top, a channel layer, a barrier structure and a contact layer and has a recess on a top surface thereof so as to expose a portion of the barrier structure. The barrier structure has a first barrier layer. The channel layer is made of a material having an electron affinity greater than that of the first barrier layer, and the contact layer is made of a material having the same electron affinity as that of the first barrier layer.

A gate electrode is disposed on the exposed portion of the barrier structure so as to be in Schottky contact with the barrier structure. Further, a source electrode and a drain electrode are respectively provided on the top surface of the semiconductor structure to be in Ohmic contact with the contact layer.

The first barrier layer preferably has a higher resistance than that of the channel layer, and a thickness of about from 5 nm to 15 nm.

In one embodiment, the channel layer is an n-type InGaAs layer, the first barrier layer is an undoped GaAs layer, and the contact layer is an n-type GaAs layer.

The semiconductor structure may further include a buffer layer between the channel layer and the substrate such that the buffer layer is in contact with the channel layer, and the buffer layer is made of an undoped material having the same electron affinity as that of the channel layer.

The barrier structure may have more than one barrier layer. The semiconductor structure also has more than one channel layer.

According to the preferred embodiments of the invention, the channel layer is formed from a material having an electron affinity greater than that of the barrier layer which contacts the channel layer, and the low-resistance contact layer is made from a material having an electron affinity equal to that of the barrier layer which contacts the contact layer. Thus, a field effect transistor having a low access resistance (the series resistance between the source and the gate or between the drain and the gate) and accordingly having a high transconductance and a high cut-off frequency can be achieved merely by performing a simple process with a combination of epitaxial growing and recess etching.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIG. 2 illustrates the conduction band diagram under the source electrode (or the drain electrode) and under the gate electrode of the field effect transistor shown in FIG. 1.

FIG. 3 illustrates the conduction band diagram under the source electrode (or the drain electrode) and under the gate electrode of the conventional field effect transistor shown in FIG. 7.

DETAILED DESCRIPTION OF PREFERRED EMBODIMENTS

Figure 1:
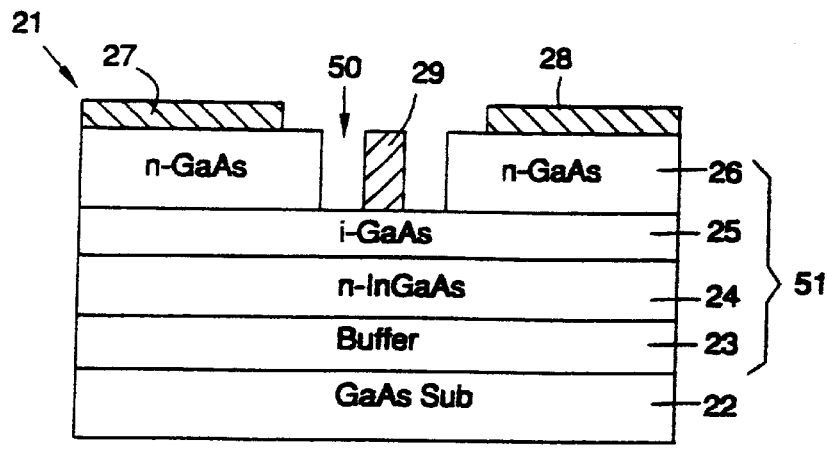
FIG. 1A schematically illustrates the cross-sectional structure of a field effect transistor according to a first embodiment of the present invention.
FIG. 1B schematically illustrates the cross-sectional structure of a field effect transistor 21 according to one variation of the first embodiment of the present invention.
Figure 1:
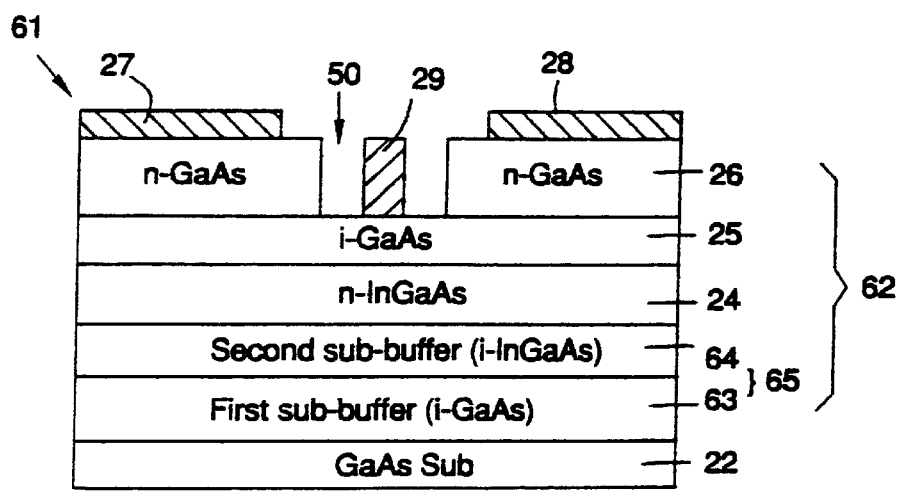

Hereinafter, the preferred embodiments of the present invention are explained in detail with reference to the drawings. In the drawings, the same elements or the corresponding elements explained in the respective embodiment are designated by like reference numerals. It is also noted that each figure illustrates a schematic structure and does not show the actual thickness ratio of each semiconductor layer.
First Embodiment FIG. 1A schematically illustrates the cross-sectional structure of a field effect transistor 21 according to a first embodiment of the present invention. The field effect transistor 21 is a heterostructure insulated gate FET. As shown in FIG. 1, the field effect transistor 21 has a GaAs substrate 22 and a semiconductor structure 51 disposed on the GaAs substrate 22.

The semiconductor structure 51 includes a buffer layer 23, a channel layer 24 formed on the buffer layer 23, a barrier layer 25 formed on the channel layer 24 and a contact layer 26 formed on the barrier layer 26. The buffer layer 23 has a high resistance and is generally made of undoped GaAs. The buffer layer 23 is formed so as to suppress the influence of lattice defects of the GaAs substrate and provide an excellent surface on which a device structure of the field effect transistor 21 is formed. The channel layer 24 has a low resistance and is made of n-InGaAs. Since the InGaAs has a lattice constant larger than that of GaAs, the channel layer 24 is a strained layer. The thickness and the composition ratio of the channel layer 24 is controlled so that the channel layer 24 can exist stably on the buffer layer 23.

The barrier layer 25 employed as a barrier structure has a high resistance, i.e., a resistance higher than that of the channel layer 24 and is made of i-GaAs. It is noted that the GaAs is selected so that the material of the channel layer 24 has an electron affinity greater than that of the barrier layer 25 with which the channel layer 24 is in contact. The contact layer 26 has a low resistance to realize a good Ohmic contact with a source electrode 27 and a drain electrode 28 which will be explained in detail later. In this case, the contact layer 26 is made of n-GaAs, and GaAs is selected so that the material of the contact layer 26 has the same electron affinity as that of the barrier layer 25 with which the contact layer 26 is in contact.

The semiconductor structure 51 has a recess 50 on a top surface of the semiconductor structure 51. The recess 50 extends in a first direction and divides the contact layer into two regions. A portion of the barrier layer 25 is exposed by the recess 50.

The source electrode 27 and The drain electrode 28 are formed on the divided regions of the contact layer 26, and a gate electrode 29 is disposed on the exposed barrier layer 25. The source electrode 27 and the drain electrode 28 are in Ohmic contact with the contact layer 26 while the gate electrode is in Schottky contact with the barrier layer 25.

The field effect transistor 21 can be produced by the following method. Specifically, a semiconductor buffer layer 23 having a carrier concentration of $1 \times 10^{16}$ cm$^{-3}$ or less is first epitaxially grown on a GaAs substrate 22 through an epitaxial growing method. A Si-doped n-InGaAs channel layer 24, an undoped i-GaAs barrier layer 25 having a residual carrier concentration of $10^{16}$ cm$^{-3}$ or less and a Si-doped n-GaAs contact layer 26 are further epitaxial grown on the buffer layer 23, thereby forming a semiconductor structure 51 on the GaAs substrate 22.

Thereafter, the semiconductor structure 51 is isolated to each device region by a mesa etching or ion implanting method.

After an AuGe/Ni/Au multilayered pattern is formed on the surface of the contact layer 26 by deposition and lift-off methods, the pattern is alloyed to form a source electrode 27 and a drain electrode which are in Ohmic contact with the contact layer 26.

The gate pattern is formed by using a photolithographic method again where the contact layer 26 is removed by etching by an amount at least equal to the thickness of the layer 26. Alternatively, a portion of the barrier layer 25 may be etched as long as the surface of the barrier layer 25 is exposed. A gate electrode 29 made of, for example, a Ti/Pt/Au multilayered electrode, is formed on the exposed surface of the barrier layer 25 by the deposition and lift-off methods, thereby forming Schottky contact between the gate electrode 29 and the barrier layer 25.

Hereinafter, the operation of the field effect transistor 21 will be explained in detail.

Figure 7:
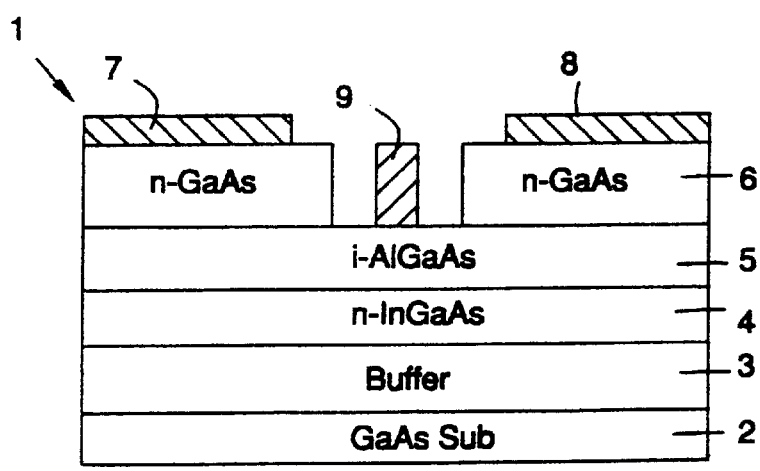
FIG. 7 schematically illustrates the cross-sectional structure of a conventional field effect transistor.

FIG. 2 illustrates the conduction band diagram under the source electrode 27 (or the drain electrode 28) and under the gate electrode 29 of the field effect transistor 21 having the above-described structure. FIG. 3 illustrates the conduction band diagram under the source electrode 7 (or the drain electrode 8) and the gate electrode 9 of the conventional field effect transistor shown in FIG. 7. In FIGS. 2 and 3, the horizontal axis represents an energy level, and the vertical axis represents a position along the depth direction of the field effect transistor shown at the center portion of the figures. The line denoted as $E_F$ indicates the Fermi level in the semiconductor structure.

As shown in FIG. 3, in the conventional field effect transistor 1, the conduction band of the barrier layer 5 is positioned at a level higher than that of the contact layer 6 or the channel layer 4. Therefore, the resistance (access resistance) from the source electrode 7 (the drain electrode 8) to the channel layer 4 becomes very large.

In contrast, in the field effect transistor 21 according to the first embodiment of the present invention, the contact layer 26 and the barrier layer 25 are composed of a material having the same level of electron affinity. Thus, the semiconductor structure of the field effect transistor 21 has a single heterostructure to form only a spike as an energy barrier at the interface between the barrier layer 25 and the channel layer 24, as illustrated in FIG. 2. Since the potential barrier is approximately represented by a triangle shape, as shown in FIG. 2, the effective barrier thickness can be reduced to increase the electron tunneling rate.

In this field effect transistor 21, the barrier layer 25 is preferably formed of an undoped layer having a thickness ranging from about 5 nm to 15 nm so as to allow the heterojunction field effect transistor 21 to correctly exhibit performance as a field effect transistor. More specifically, the barrier layer 25 having a thickness of about 5 nm or greater sufficiently serves to interrupt electrons from flowing under the gate electrode 29. The barrier layer 25 having a thickness of about 15 nm or less serves to facilitate electrons to flow from the contact layer 26 to the channel layer 24 via the barrier layer 25.

Moreover, since the contact layer 26 and the barrier layer 25 are made from a material having the same level of electron affinity, conduction band discontinuity ($\Delta E_c$) is not formed therebetween. As a result, the effective barrier height viewed from the contact layer 26 decreases by an amount equal to $\Delta E_c$, thereby increasing the thermally ionized current component which flows into the channel layer 24 over the barrier. Because of the foregoing reason, the access resistance from the source electrode 27 or the drain electrode 28 to the channel layer 24 can be decreased.

In the field effect transistor 21 explained in the first embodiment, the materials for the contact layer 26, the barrier layer 25, the channel layer 24, and the substrate 22 are GaAs, GaAs, InGaAs, and GaAs, respectively. The materials are not, however, limited to the above combination, and other combinations shown in Table 1 may be possible.

TABLE 1

| Contact | Barrier layer | Channel layer | Substrate |
| --- | --- | --- | --- |
| AlGaAs | AlGaAs | InGaAs | GaAs |
| AlGaAs | AlGaAs | GaAs | GaAs |
| InGaP | InGaP | InGaAs | GaAs |
| InGaP | InGaP | GaAs | GaAs |
| InP | InP | InGaAs | InP |
| InAlAs | InAlAs | InGaAs | InP |
| InAlGaP | InAlGaP | InGaAs | InP |
| InAlGaP | InAlGaP | InP | InP |
| InAlGaP | InAlAs | InP | InP |

Variation of First Embodiment

FIG. 1B shows one of the optimal structures according to the first embodiment. As shown in FIG. 1B, a field effect transistor 61 has a semiconductor structure 62 on a GaAs substrate 22. The semiconductor structure 62 is different from the semiconductor structure 51 shown in FIG. 1A in that a buffer layer of the semiconductor structure 62 includes first and second buffer layers having different electron affinities. Specifically, in the semiconductor structure 62, a buffer layer 65 includes a first sub-buffer layer 63 formed of u-GaAs and a second sub-buffer layer 64 formed of u-InGaAs. The second sub-buffer layer 64 is in contact with the channel layer 24 and has the same electron affinity as that of the channel layer 24. The first sub-buffer layer 63 is provided between the first sub-buffer layer 64 and the GaAs substrate 22 and has an electron affinity smaller than that of the second sub-buffer layer 64. The film thickness and carrier concentration of each layer are shown in Table 2.

TABLE 2

| Layer | Composition | Thickness (nm) | Carrier concentration ($cm^{-3}$) |
|---|---|---|---|
| Contact layer 26 | n-GaAs | 100 | $6 \times 10^{18}$ |
| Barrier layer 25 | i-GaAs | 15 | $\leq 10^{15}$ |
| Channel layer 24 | n-InGaAs | 10 | $5 \times 10^{18}$ |
| Second buffer layer 64 | i-InGaAs | 5 | $\leq 10^{16}$ |
| First buffer layer 63 | i-GaAs | 500 | $\leq 10^{16}$ |

According to the structure of FIG. 1B, the second sub-buffer layer 64 which has the same composition of the channel layer 24 but less carrier concentration is provided between the channel layer 63 and the first buffer-layer 63. This prevents the channel layer 24 from being depleted due to the heterojunction between the channel layer 24 and the first sub-buffer layer 63 and prevents the carriers in the channel layer 24 from decreasing. Thus, the field effect transistor 61 exhibits excellent performances.

Second Embodiment

Figure 4:
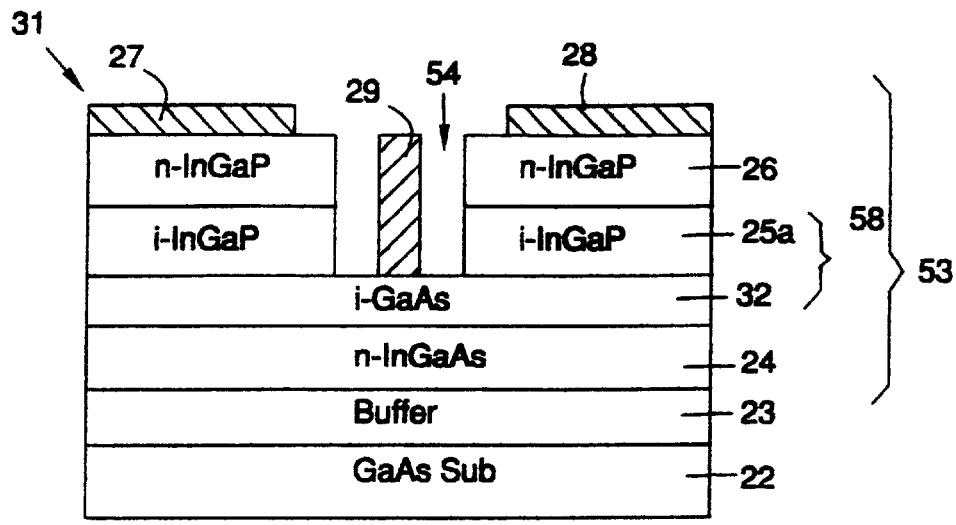
FIG. 4 schematically illustrates the cross-sectional structure of a field effect transistor according to a second embodiment of the present invention.

FIG. 4 schematically illustrates the cross-sectional structure of a field effect transistor 31 according to a second embodiment of the present invention.

The field effect transistor 31 has a semiconductor structure 53 on a GaAs substrate 22. The semiconductor structure 53 is different from the semiconductor structure 51 shown in FIG. 1 in that the semiconductor structure 53 includes a barrier structure 58 having two barrier layers, i.e., a first barrier layer 25a and a second barrier layer 32, between a channel layer 24 and a contact layer 26.

The second barrier layer 32 is disposed on the channel layer 24 made of n-InGaAs and is formed of i-GaAs. The GaAs is selected as a material having an electron affinity smaller than the material for the channel layer 24. The first barrier 25 a is formed of i-InGaP and disposed between the second barrier layer 32 and the contact layer 26. The InGaP is selected as a material having an electron affinity smaller than the materials for the second barrier layer 32 and the channel layer 24 and equal to the material for the contact layer 26. The contact layer 26 is made of n-InGaP having a low resistance.

In the field effect transistor 31, a recess 54 formed on an upper surface of the semiconductor structure 53 exposes the second barrier layer 32 and a gate electrode 29 is disposed on the second barrier layer 32. According to the structure, the recess 54 is easily formed on the semiconductor structure 53 by a wet etching method as the etching speeds of the second barrier layer 32 and the first barrier layer 25a are different due to the different materials thereof. However, the gate electrode 29 may be formed on the first barrier layer 25a as long as the gate electrode 29 is disposed on a portion of the barrier structure 58.

The principle of the reduced access resistance of the second embodiment is fundamentally similar to that of the first embodiment, and the second embodiment exhibits the advantages of this invention although the barrier layer is formed of the two-layered structure, i.e., the first and second barrier layers 25a and 32.

Referring to FIG. 4, in order to obtain the field effect transistor 31, a high-resistance semiconductor buffer layer 23 having a carrier concentration of $1 \times 10^{16}$ $cm^{-3}$ or less, a Si-doped n-InGaAs low-resistance channel layer 24, and an undoped i-GaAs second high-resistance barrier layer 32 having a residual carrier concentration of $10^{16}$ $cm^{-3}$ or less are sequentially formed on a semi-insulating GaAs substrate 22 in a manner substantially similar to the first embodiment. As in the first embodiment, the material for forming the channel layer 24 has an electron affinity greater than the material for the second barrier layer 32 which contacts the channel layer 24, i.e., which is placed immediately on the channel layer 24.

Further, in the second embodiment, an undoped i-InGaP first high-resistance barrier layer 25a having a residual carrier concentration of $10^{16}$ $cm^{-3}$ or less is formed on the second barrier layer 32 according to an epitaxial growing method.

A Si-doped n-InGaP low-resistance contact layer 26 is then formed on the first barrier layer 25a by an epitaxial growing method. The material for forming the low-resistance contact layer 26 has an electron affinity equal to the material for the first barrier layer 25a which contacts the contact layer 26, i.e., which is placed immediately under the contact layer 26.

In this manner, the high-resistance buffer layer 23, the channel layer 24, the second barrier layer 32, the first barrier layer 25a, and the low-resistance contact layer 26 are sequentially stacked on the GaAs substrate 22 so as to obtain a semiconductor structure 53. Then, the semiconductor structure 53 is isolated into each device by mesa etching or ion implantation.

Thereafter, a source electrode 27 and a drain electrode 28 are disposed on the surface of the low-resistance contact layer 26 by the same materials and methods similar to those of the first embodiment, thereby forming a source region and a drain region, respectively.

Moreover, a gate pattern is opened by using a photolithographic method again where the low-resistance contact layer 26 and the second barrier layer 32 are removed by etching by an amount at least equal to the thickness of the layers 26 and 32. Formed on the second barrier layer 32 which is exposed by the removal of the layers 26 and 25a as described above is a gate electrode 29 by using the method and constituent materials similar to those of the first embodiment, thereby forming a gate region. The field effect transistor 31 is thus completed.

In the field effect transistor 31 of the second embodiment, the constituent materials for the low-resistance contact layer 26, the first barrier layer 25a, the second barrier layer 32, the channel layer 24, and the substrate 22 are InGaP, InGaP, GaAs, InGaAs, and GaAs, respectively. The materials are not, however, restricted to the above combination, and other combinations shown in Table 3 may be possible.

TABLE 3

| Contact | First | Second | Channel | Substrate |
|---|---|---|---|---|
| AlGaAs | AlGaAs | GaAs | InGaAs | GaAs |
| InGaP | InGaP | AlGaAs | GaAs | GaAs |
| InGaP | InGaP | AlGaAs | InGaAs | GaAs |
| AlGaAs | AlGaAs | InGaP | GaAs | GaAs |
| AlGaAs | AlGaAs | InGaP | InGaAs | GaAs |
| InAlAs | InAlAs | InP | InGaAs | InP |
| InAlGaP | InAlGaP | InP | InGaAs | InP |
| InAlGaP | InAlGaP | InAlAs | InGaAs | InP |

Further, a buffer layer having two sub-buffer layers may be applied to the device according to this embodiment, as explained in the variation of the First Embodiment.

Third Embodiment

Figure 5:
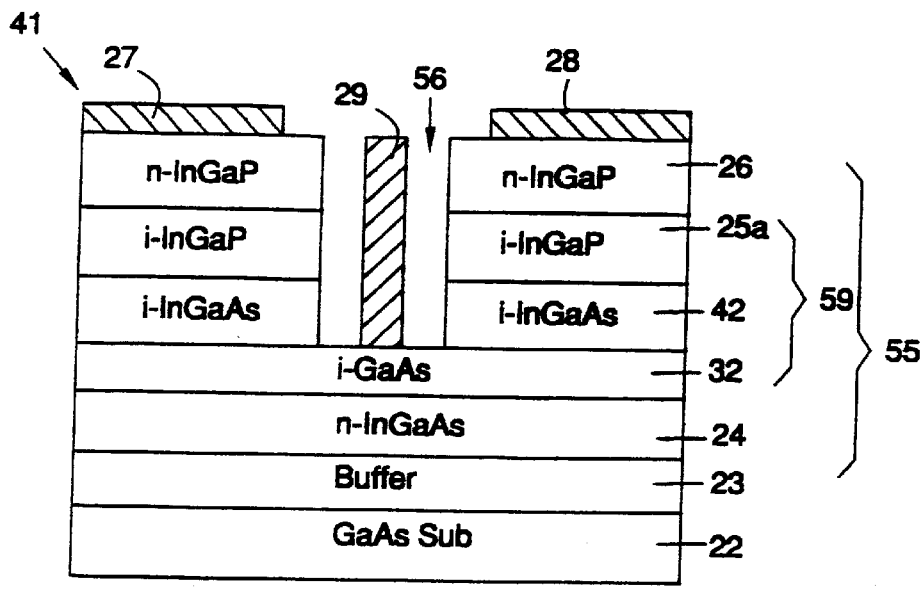
FIG. 5 schematically illustrates the cross-sectional structure of a field effect transistor according to a third embodiment of the present invention.

FIG. 5 schematically illustrates the cross-sectional structure of a field effect transistor 41 according to a third embodiment of the present invention.

The field effect transistor 41 has a semiconductor structure 55 on a GaAs substrate 22. The semiconductor structure 55 is different from the semiconductor structure 51 shown in FIG. 1 in that the semiconductor structure 55 includes a barrier structure 59 having three barrier layers, i.e., a first barrier layer 25a, a second barrier layer 32 and a third barrier layer 42, between a channel layer 24 and a contact layer 26.

The second barrier layer 32 is disposed on a channel layer 24 made of n-InGaAs and is formed of i-GaAs. The GaAs is selected as a material having an electron affinity smaller than the material for the channel layer 24. The third barrier 42 is formed of i-InGaAs and disposed on the second barrier layer 32. The InGaAs is selected as a material having an electron affinity greater than the material for the second barrier layer 32. The first barrier layer 25a is formed of i-InGaP and disposed between the third barrier layer 32 and the contact layer 26. The InGaP is selected as a material having an electron affinity smaller than the materials for the second barrier layer 32 and the channel layer 24 and equal to the material for the contact layer 26. The contact layer 26 is made of n-InGaP having a low resistance.

In the field effect transistor 41, a recess 56 formed on an upper surface of the semiconductor structure 53 exposes the second barrier layer 32 and a gate electrode 29 is disposed on the second barrier layer 32. According to the structure, the recess 56 is easily formed on the semiconductor structure 55 by a wet etching method as the etching speeds of the second barrier layer 32 and the third barrier layer 42 are different due to the different materials thereof. However, the gate electrode 29 may be formed on either the first barrier layer 25a, the second layer 32 or the third layer 42 as long as the gate electrode 29 is disposed on a portion of the barrier structure 59.

The principle of the reduced access resistance of the third embodiment is fundamentally similar to that of the first and second embodiments, and the third embodiment exhibits the advantages of the invention although the barrier layer is formed of the multi-layered structure, i.e., the first, second and third barrier layers 25a, 32 and 42, as discussed above.

Referring to FIG. 5, in order to obtain a field effect transistor 41, a high-resistance semiconductor buffer layer 23 having a carrier concentration of $1 \times 10^{16}$ cm$^{-3}$ or less, a Si-doped n-InGaAs low-resistance channel layer 24, an undoped i-GaAs second high-resistance barrier layer 32 having a residual carrier concentration of $10^{16}$ cm$^{-3}$, and an undoped i-GaAs third high-resistance barrier layer 42 having a residual carrier concentration of $10^{16}$ cm$^{-3}$ or less are sequentially formed on a semi-insulating GaAs substrate 22 in a manner substantially similar to the second embodiment. As in the first and second embodiments, the constituent material for forming the channel layer 24 has an electron affinity greater than the material for the second barrier layer 32 which contacts the channel layer 24, i.e., which is placed immediately on the channel layer 24.

Further, in the third embodiment, an undoped i-InGaP first high-resistance barrier layer 25a having a residual carrier concentration of $10^{16}$ cm$^{-3}$ or less is formed on the third barrier layer 42 by the epitaxial growing method.

A Si-doped n-InGaP low-resistance contact layer 26 is formed on the first barrier layer 25a by an epitaxial growing method. The constituent material for the low-resistance contact layer 26 has an electron affinity equal to the material for the first barrier layer 25a which contacts the contact layer 26, i.e., which is located immediately under the contact layer 26.

In this manner, the high-resistance buffer layer 23, the channel layer 24, the second barrier layer 32, the third barrier layer 42, the first barrier layer 25a, and the low-resistance contact layer 26 are sequentially stacked on the GaAs substrate 22 so as to obtain a stacked structure 55. Then, the stacked structure 55 is isolated into each device by mesa etching or ion implantation.

Thereafter, a source electrode 27 and a drain electrode 28 are disposed on the surface of the low-resistance contact layer 26 by the same materials and methods similar to those of the first embodiment, thereby forming a source region and a drain region, respectively.

Moreover, a gate pattern is opened by using a photolithographic method again where the low-resistance contact layer 26 and the first and third barrier layers 25a and 42 are removed by etching by an amount at least equal to the thickness of the layers 26, 25a and 42. Formed on the second barrier layer 32 which is exposed by the removal of the layers 26, 25a and 42 as described above is a gate electrode 29 by using the methods and constituent materials similar to those of the first and second embodiments, thereby forming a gate region. The field effect transistor 41 is thus completed.

In the field effect transistor 41 of the third embodiment, the constituent materials for the low-resistance contact layer 26, the first barrier layer 25a, the third barrier layer 42, the second barrier layer 32, the channel layer 24, and the substrate 22 are InGaP, InGaP, InGaAs, GaAs, InGaAs, and GaAs, respectively. The materials are not, however, restricted to the above combination, and other combinations shown in Table 4 may be possible.

TABLE 4

| Contact | First | Third | Second barrier | Channel | Substrate |
| --- | --- | --- | --- | --- | --- |
| InGaP | InGaP | AlGaAs | GaAs | InGaAs | GaAs |
| AlGaAs | AlGaAs | InGaP | GaAs | InGaAs | GaAs |
| InGaP | InGaP | InGaAs | InGaP | InGaAs | GaAs |
| AlGaAs | AlGaAs | InGaAs | AlGaAs | InGaAs | GaAs |
| InGaP | InGaP | InGaAs | AlGaAs | InGaAs | GaAs |
| AlGaAs | AlGaAs | InGaAs | InGaP | InGaAs | GaAs |
| InGaP | InGaP | GaAs | InGaP | InGaAs | GaAs |
| AlGaAs | AlGaAs | GaAs | AlGaAs | InGaAs | GaAs |
| InGaP | InGaP | GaAs | AlGaAs | InGaAs | GaAs |
| AlGaAs | AlGaAs | GaAs | InGaP | InGaAs | GaAs |
| InAlAs | InAlAs | InGaAs | InP | InGaAs | InP |
| InAlAs | InAlAs | InGaAs | InAlAs | InGaAs | InP |
| InP | InP | InGaAs | InAlAs | InGaAs | InP |
| InP | InP | InGaAs | InP | InGaAs | InP |

Further, a buffer layer having two sub-buffer layers may be applied to the device according to this embodiment, as explained in the variation of the First Embodiment.

Fourth Embodiment

Figure 6:
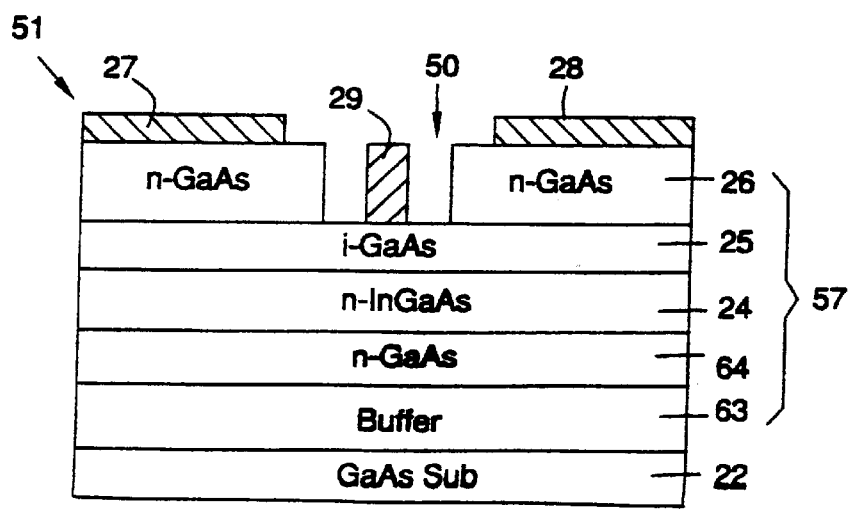
FIG. 6 schematically illustrates the cross-sectional structure of a field effect transistor according to a fourth embodiment of the present invention.
Figure 8:
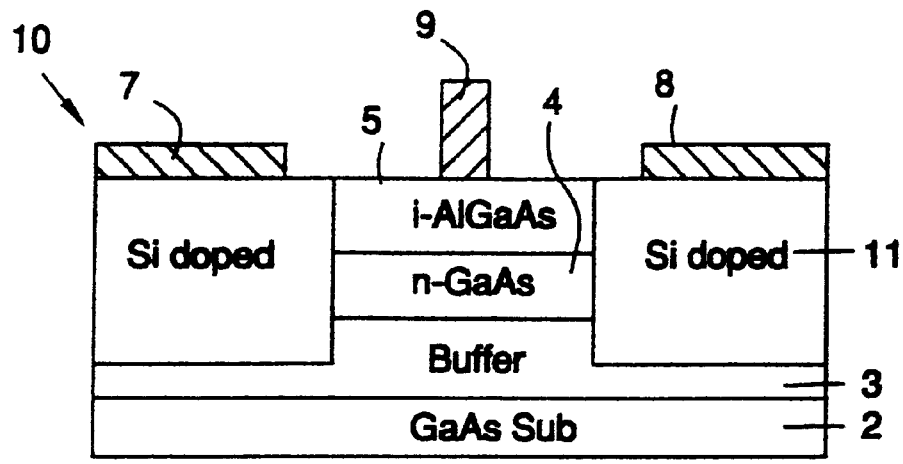
FIG. 8 schematically illustrates the cross-sectional structure of another conventional field effect transistor.
Figure 9:
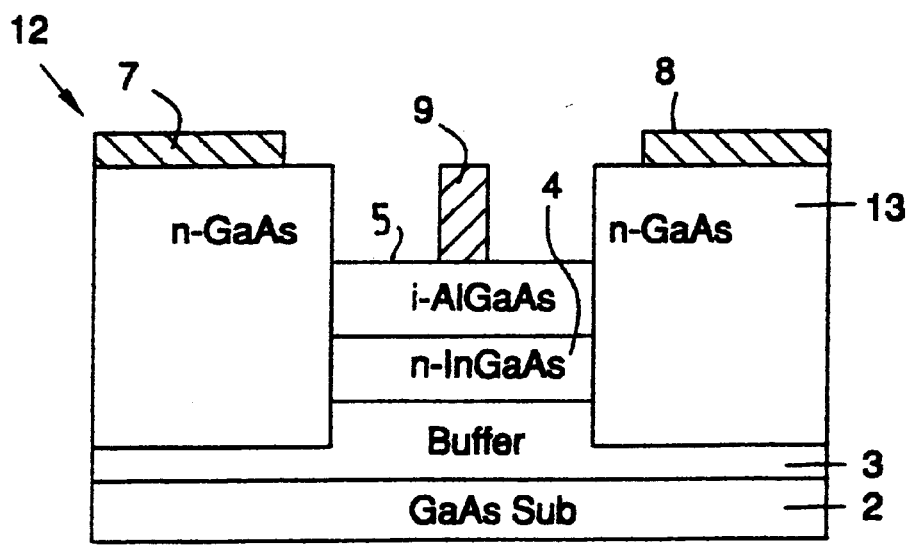
FIG. 9 schematically illustrates the cross-sectional structure of a still another conventional field effect transistor.

FIG. 6 schematically illustrates the cross-sectional structure of a field effect transistor 51 according to a fourth embodiment of the present invention.

The field effect transistor 51 has a semiconductor structure 57 on a GaAs substrate 22. The semiconductor structure 57 is different from the semiconductor structure 51 shown in FIG. 1 in that the semiconductor structure 57 includes two channel layers, i.e., a first channel layer 24a and a second channel layer 52, between a buffer layer 23 and a barrier layer 25.

The second channel layer 52 is disposed on the buffer layer 23 and made of the n-GaAs. The first channel layer 24a is disposed between the first channel layer 52 and the barrier layer 25 and made of n-InGaAs. The material for the first channel layer 24a and the material for the second channel layer 52 have an electron affinity greater than that of the barrier layer 25.

The principle of the reduced access resistance of the fourth embodiment is fundamentally similar to that of the first embodiment, and the fourth embodiment exhibits the advantages of the invention although the channel layer is formed of a double-layered structure, i.e., the first and second channel layers 24a and 52, or formed of a multi-layered structure.

Referring to FIG. 6, in order to obtain the field effect transistor 51, a high-resistance semiconductor buffer layer 23 having a carrier concentration of $1 \times 10^{16}$ cm$^{-3}$ or less is first formed on a semi-insulating GaAs substrate 22 in a manner substantially similar to the first embodiment.

A Si-doped n-GaAs second low-resistance channel layer 52 is then disposed on the high-resistance semiconductor buffer layer 23 according to an epitaxial growing method.

Subsequently, a Si-doped n-InGaAs first low-resistance channel layer 24a, an undoped i-GaAs high-resistance barrier layer 25 having a residual carrier concentration of $10^{16}$ cm$^{-3}$ or less, and a Si-doped n-GaAs low-resistance contact layer 26 are sequentially formed on the second channel layer 52 in a manner substantially similar to the first embodiment. As in the first embodiment, the material for forming the second channel layer 24a has an electron affinity greater than the material for the barrier layer 25 which contacts the first channel layer 24a, i.e., which is placed immediately on the first channel layer 24a, and the material for the low-resistance contact layer 26 has an electron affinity equal to the material for the barrier layer 25 which contacts the contact layer 26, i.e., which is located immediately under the contact layer 26.

In this manner, the high-resistance buffer layer 23, the first channel layer 52, the first channel layer 24a, the barrier layer 25, and the low-resistance contact layer 26 are sequentially stacked on the GaAs substrate 22 so as to obtain a stacked structure. Then, the semiconductor structure 57 is isolated into each device by mesa etching or ion implantation.

Thereafter, a source electrode 27 and a drain electrode 28 are disposed on the surface of the low-resistance contact layer 26 by the same materials and methods similar to those of the first embodiment, thereby forming a source region and a drain region, respectively.

Moreover, a gate pattern is opened by using a photolithographic method again where the low-resistance contact layer 26 is removed by etching by an amount at least equal to the thickness of the layer 26. Formed on the surface of the barrier layer 25 which is exposed by the removal of the layer 26 as described above is a gate electrode 29 by using the method and constituent materials similar to those of the first embodiment, thereby forming a gate region. The field effect transistor 51 is thus completed.

In the field effect transistor 51 of the fourth embodiment, the constituent materials for the low-resistance contact layer 26, the barrier layer 25, the first channel layer 24a, the second channel layer 52, and the substrate 22 are GaAs, GaAs, InGaAs, GaAs, and GaAs, respectively. The materials are not, however, restricted to the above combination, and other combinations shown in Table 5 may be possible.

TABLE 5

| Contact | Barrier | First channel | Second channel | Substrate |
| --- | --- | --- | --- | --- |
| InGaP | InGaP | GaAs | InGaAs | GaAs |
| InGaP | InGaP | InGaAs | GaAs | GaAs |
| AlGaAs | AlGaAs | GaAs | InGaAs | GaAs |
| AlGaAs | AlGaAs | InGaAs | GaAs | GaAs |
| InAlAs | InAlAs | InP | InGaAs | InP |
| InAlAs | InAlAs | InGaAs | InP | InP |

TABLE 5-continued

| Contact | Barrier | First channel | Second channel | Substrate |
| --- | --- | --- | --- | --- |
| InP | InP | InGaAs | InP | InP |
| InAlGaP | InAlGaP | InP | InGaAs | InP |
| InAlGaP | InAlGaP | InGaAs | InP | InP |

In the foregoing embodiments, the present invention is explained as a heterostructure insulated-gate field effect transistor in which a barrier layer has a high resistance as an insulating layer. The present invention can be most suitably applied to such a heterostructure insulated-gate field effect transistor for solving problems associated with series resistance between a gate electrode and a source/drain electrode.

The present invention may also be applied to other types of field effect transistors, such as a high electron mobility transistor (HEMT), or the like as long as the field effect transistor to which the present invention is applied has a heterostructure. In the case where the present invention is applied to a high electron mobility transistor, the channel layer and the barrier layer explained above correspond to an undoped layer in which a two dimensional electron gas is formed and a donor layer which supplies electrons to the undoped layer, respectively although the undoped layer has a high resistance and the donor layer has a low resistance.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A field effect transistor comprising:
   a substrate made of GaAs;
   a channel layer over the substrate;
   at least a first barrier layer over the channel layer;
   a contact layer over the first barrier layer, the channel layer being made of a material having an electron affinity greater than that of the first barrier layer, the contact layer being made of a material having the same electron affinity as that of the first barrier layer and the first barrier having a higher resistance than that of the channel layer;
   a gate electrode in contact with the first barrier layer; and,
   a source electrode and a drain electrode in contact with the contact layer, wherein the channel layer, the first barrier layer and the contact layer are lattice-matched to the substrate.

2. A field effect transistor according to claim 1, wherein the first barrier layer is made of an undoped material.

3. A field effect transistor comprising:
   a substrate made of GaAs;
   a semiconductor structure disposed on a substrate, the semiconductor structure comprising, in order, from bottom to top, a channel layer, a barrier structure and a contact layer, the semiconductor structure having a recess on a top surface thereof so as to expose a portion of the barrier structure, the barrier structure having a first barrier layer, the channel layer being made of a material having an electron affinity greater than that of the first barrier layer, the contact layer being made of a material having the same electron affinity as that of the first barrier layer and the first barrier having a higher resistance than that of the channel layer, wherein the channel layer, the barrier structure and the contact layer are lattice-matched to the substrate;

a gate electrode disposed on the exposed portion of the barrier structure, the gate electrode being in Schottky contact with the barrier structure; and a source electrode and a drain electrode respectively provided on the top surface of the semiconductor structure, the source electrode and the drain electrode being in Ohmic contact with the contact layer.

4. A field effect transistor according to claim 3, wherein the first barrier layer is made of an undoped material.

5. A field effect transistor according to claim 3, wherein the field effect transistor is a heterostructure insulated-gate field effect transistor.

6. A field effect transistor comprising:

a semiconductor structure disposed on a substrate, the semiconductor structure comprising, in order, from bottom to top, a channel layer, a barrier structure and a contact layer, the semiconductor structure having a recess on a top surface thereof so as to expose a portion of the barrier structure, the barrier structure having a first barrier layer having a higher resistance than that of the channel layer, the channel layer being made of a material having an electron affinity greater than that of the first barrier layer, the contact layer being made of a material having the same electron affinity as that of the first barrier layer, said first barrier layer having a thickness of about form 5 nm to 15 nm;

a gate electrode disposed on the exposed portion of the barrier structure, the gate electrode being in Schottky contact with the barrier structure; and a source electrode and a drain electrode respectively provided on the top surface of the semiconductor structure, the source electrode and the drain electrode being in Ohmic contact with the contact layer.

7. A field effect transistor comprising:

a semiconductor structure disposed on a substrate, the semiconductor structure comprising, in order, from bottom to top, a channel layer, a barrier structure and a contact layer, the semiconductor structure having a recess on a top surface thereof so as to expose a portion of the barrier structure, the barrier structure having a first barrier layer having a higher resistance than that of the channel layer, the channel layer being made of a material having a electron affinity greater than that of the first barrier layer, the contact layer being made of a material having the same electron affinity as that of the first barrier layer, the channel layer is an n-type InGaAs layer, the first barrier layer is a undoped GaAs layer, and the contact layer is an n-type GaAs layer;

a gate electrode disposed on the exposed portion of the barrier structure, the gate electrode being in Schottky contact with the barrier structure; and a source electrode and a drain electrode respectively provided on the top surface of the semiconductor structure, the source electrode and the drain electrode being in Ohmic contact with the contact layer.

8. A field effect transistor according to claim 7, wherein the semiconductor structure further includes a buffer layer between the channel layer and the substrate such that the buffer layer is in contact with the channel layer, the buffer layer being made of an undoped material having the same electron affinity as that of the channel layer.

9. A field effect transistor comprising:

a semiconductor structure disposed on a substrate, the semiconductor structure comprising, in order, from bottom to top, a channel layer, a barrier structure and a contact layer, the semiconductor structure having a recess on a too surface thereof so as to expose a portion of the barrier structure, the barrier structure having a first barrier layer, the channel layer being made of a material having an electron affinity greater than that of the first barrier layer, the contact layer being made of a material having the same electron affinity as that of the first barrier layer, the barrier structure further including a second barrier layer between the first barrier layer and the channel layer, the second barrier layer being made of a material having an electron affinity smaller than the material of the channel layer and greater than the material of the first barrier layer;

a gate electrode disposed on the exposed portion of the barrier structure, the gate electrode being in Schottky contact with the barrier structure; and a source electrode and a drain electrode respectively provided on the top surface of the semiconductor structure, the source electrode and the drain electrode being in Ohmic contact with the contact layer.

10. A field effect transistor according to claim 9, wherein the barrier structure further includes a third barrier layer between the first barrier layer and the second barrier layer, the third barrier layer being made of a material having a electron affinity greater than the material of the second barrier layer.

11. A field effect transistor according to claim 9, wherein the semiconductor structure further includes another channel layer between the substrate and the first channel layer.

* * * * *